United States Patent [19]

Lejeune et al.

[11] 4,128,806

[45] Dec. 5, 1978

[54] DEVICE FOR CHECKING THE INSULATION OF THE LEADS CONNECTING A GENERATOR TO A RECEIVER

[75] Inventors: Gérard Lejeune, Fosses; Jean-Claude Dubreucq, Paris, both of France

[73] Assignee: Inter-Elec, Drancy, France

[21] Appl. No.: 819,125

[22] Filed: Jul. 26, 1977

[30] Foreign Application Priority Data

Jul. 26, 1976 [FR] France .................. 76 22773

[51] Int. Cl.² ................ G01R 31/02; G01R 31/12
[52] U.S. Cl. ...................... 324/54; 324/51
[58] Field of Search ............ 324/51, 54; 340/255

[56] References Cited

U.S. PATENT DOCUMENTS

| | | |
|---|---|---|
| 2,594,994 | 4/1952 | Rich .................. 324/51 |
| 2,695,399 | 11/1954 | Martin .................. 324/51 X |
| 2,832,916 | 4/1958 | Kennedy .................. 324/51 X |
| 2,895,104 | 7/1959 | Hansen et al. .................. 340/255 X |
| 3,066,284 | 11/1962 | McKinley et al. .................. 340/255 |
| 3,710,238 | 1/1973 | Peterson .................. 324/51 |

Primary Examiner—Gerard R. Strecker
Attorney, Agent, or Firm—Weiser, Stapler & Spivak

[57] ABSTRACT

A device for checking the insulation of the leads connecting a power generator to a receiver. The receiver is sensitive to d.c. signals having an amplitude above a given threshold. A first output of an interference generator is connected to the first lead via a current detector and a resistor. A second output of the interference generator is connected to the second lead via a checking generator transmitting a.c. signals and a resistor. The current detector is sensitive only to a.c. signals transmitted by the checking generator.

10 Claims, 3 Drawing Figures

DEVICE FOR CHECKING THE INSULATION OF THE LEADS CONNECTING A GENERATOR TO A RECEIVER

BACKGROUND OF THE INVENTION

The invention relates to a device for checking the insulation of the leads connecting a power generator to a receiver sensitive to signals having a set nature and an amplitude above a given threshold. The invention also relates to a safety device for actuating an installation comprising a power generator, a receiver of the aforementioned kind and leads connecting the generator to a receiver.

In many installations, the electric leads connecting a generator to a receiver must be very well insulated, for safety reasons. For example, if a fault occurs in a vehicle braking system (e.g. in a train) it is essential that the signals supplied to the brake means can only be braking signals. Thus, if there is a fault in the insulation of the leads between the brake signal generator and the braking means, the faulty insulation must inevitably result in a braking instruction and not in the disappearance of this instruction.

SUMMARY OF THE INVENTION

The main object of the invention is to solve the aforementioned problem.

Another object is to provide an insulation-checking device and a safety device of the aforementioned kind which meet practical requirements better than the existing devices.

According to the invention, there is provided a device for checking the insulation of the leads connecting the outputs of a power generator to a receiver sensitive to signals, having a set nature and an amplitude above a given threshold, characterised in that, in order to check the insulation of the leads with respect to a noise or interference generator adapted to transmit signals having the set nature, it comprises:

current detecting means comprising two input terminals, the first connected to the first lead and the second connected to the first output terminal of the interference generator, the current-detecting means being sensitive to a signal having a second nature different from the set nature, insensitive to the signals having the set nature, and adapted to deliver a signal at a first level when the current between the inputs is above a threshold $i_1$ and a signal at a second level when the current is below the threshold of $i_1$;

a checking generator for producing signals having the second nature, the generator having two outputs, the first connected to the second lead and the second connected to the second output of the interference generator; and a first and a second impedance, the first being disposed in series with the current-detecting means between the first lead and the first terminal of the interference generator, and the second impedance being disposed in series with the checking generator between the second lead and the second output of the interference generator, the values of the impedances being chosen so that the amplitude of the signals produced by the interference generator and reaching the receiver is below the given threshold.

Preferably, the signals having the set nature are at a different frequency from the signals having the second nature. Advantageously, in that case, the signals having a set nature are d.c. signals, i.e. at a frequency of zero, and the signals having the second nature are a.c. signals having a frequency f.

The invention also provides a safety device for actuating an assembly comprising a power generator, a receiver and leads connecting the power generator to the receiver, the receiver being sensitive to signals having a set nature and an amplitude above a given threshold, characterised in that the power generator has a control input and the safety device comprises a checking device of the previously defined kind and control means comprising an AND gate and having an output connected to the control input, the control means having a first and a second input, the first input being adapted to receive a signal actuating the power generator and the second input being connected to the output of the current-detecting means in the checking device.

Other objects, features and advantages of the invention will be clear from the description of some embodiments thereof, the description being given with reference to the accompanying drawings, in which:

DESCRIPTION OF PREFERRED EMBODIMENT

Figure 1:
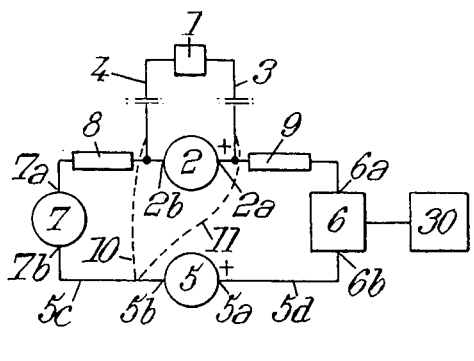
FIG. 1 is a diagram of an insulation-checking device according to the invention.

In the embodiments of checking and safety devices according to the invention, which will now be described with references to FIGS. 1 to 3, a receiver 1 comprises a solenoid valve for controlling the brakes of a train (not shown). As is known, a valve of this kind is normally supplied with d.c.; in addition, it can operate only if supplied with d.c. having a value above a given threshold $I_1$. On the other hand, the valve is insensitive to a.c. signals. In practice, for reasons of safety, receiver 1 is supplied with electricity in the absence of braking, whereas the supply is cut off when the vehicle is braked. Under these conditions, it is particularly important that valve 1 should not be accidentally energized by an interference generator delivering d.c. signals. The probability that such a fault will occur is not, in general, negligible. The reason is that valve 1 is connected to power generator 2 (a d.c. signal generator normally supplying receiver 1) via two leads 3, 4 having insulation which may, for various reasons, become faulty, in which case leads 3 and 4 may be connected to other leads at different potentials. The potential difference may produce a current in valve 1. In other words, conductors 3 and 4 may then be connected in undesired manner to a generator 5 of interfering d.c. signals. In the rest of the description, generator 5 will be called an "interference generator". A situation of this kind is more likely to occur in that potential references are usually brought about in an electrical installation using d.c. voltages.

The circuit according to the invention shown in FIG. 1 can be used at any instant to check that leads 3 and 4 connecting generator 2 to receiver 1 are insulated with respect to the terminals of the interference generator 5.

To this end, a current detector 6 having two inputs 6a, 6b and an output 6c is disposed between the lead 3 (connected to the positive output 2a of generator 2) and a first output terminal 5a (the positive terminal) of the interference generator 5. Detector 6 is sensitive only to a.c. signals having a set frequency $f$ for an adjacent frequency. Its output 6c is adapted to provide a signal indicating faulty insulation when the electric current travelling through it (between its input terminal 6a and 6b) falls below a set threshold $i_1$.

The second or lower-potential terminal 5b of generator 5 is connected to lead 4 (which is connected to the lowerpotential output terminal 2b of generator 2) via a generator 7 of ac signals having a frequency $f$. Generator 7 will hereinafter be called the "checking generator".

A "injection resistor" 8 is provided between lead 4 and the output terminal 7a of generator 7, and a "recovery resistor" 9 is similarly disposed between lead 3 and input 6a of detector 6. The main purpose of resistors 8 and 9 is to limit the current provided by generator 5 to receiver 1 to a value below threshold $I_1$, so that the current cannot affect the operation of receiver 1. As can be seen in FIG. 1, the interference generator supplies receiver 1 via a circuit comprising the following in order from terminal 5a to terminal 5b; detector 6, resistor 9, lead 3, receiver 1, lead 4, resistor 8 and generator 7. In addition, resistors 8 and 9 prevent a direct connection either between terminal 5a and lead 3 or between terminal 5b and lead 4.

During normal operation, i.e. when leads 3 and 4 are well insulated, generator 7 provides an a.c. current between inputs 6a and 6b of detector 6. The circuit supplying detector 6 via generator 7 comprises resistor 8, the parallel combination of generator 2 and receiver 1, resistor 9, the detector 6 and the interference generator 5. Since generators 2 and 5 are voltage generators, their internal impedance is relatively low; under these conditions, the internal impedances of the aforementioned generators do not interfere with the flow of a.c. provided by generator 7 via resistors 8 and 9. However, if generator 2 has an impedance which is not negligible at the frequency $f$, a capacitor (not shown) or any other means for shunting current at the frequency $f$ can be installed across its terminals.

During normal operation, the a.c. supplied by generator 7 to detector 6 has a value above the threshold $i_1$, in which case a signal having a first level appears at its output 6c.

On the other hand, if conductors 3 and 4 have a fault in the insulation with respect to terminals 5a, 5b, of generator 5, the fault will result in a reduction in the current (at frequency $f$) provided by generator 7 to detector 6. If the fault is sufficiently serious, the a.c. at frequency $f$ flowing through detector 6 will fall below the intensity thresold $i_1$, and a faulty-insulation signal at a second level will appear at output 6c.

The aforementioned faults in the insulation of leads 3 and 4 with respect to generator 5 may appear in various ways. In all cases, the faults are equivalent to a connection between one or both of leads 3, 4 and one or both output terminals of generator 5. Two examples of such connections are shown by broken lines 10, 11 in FIG. 1. Connection 10 represents a fault in the insulation between lead 4 and terminal 5b of interference generator 5, whereas connection 11 represents a fault in the insulation between lead 3 and terminal 5b. Such faults occur in the form of short-circuits or low-value resistances.

Clearly, these faults reduce the a.c. flow detector 6. Under these conditions, detector 6 may transmit a faulty insulation signal at its output 6c. The signal is used to trigger alarm means 30 (e.g. audible or visual means) and/or actuate generator 2, as we shall see hereinafter in conjunction with FIGS. 2 and 3.

In general, as we have already mentioned, generator 5 acts mainly via leads brought to set potentials, e.g. lead 5c connected to terminal 5b is earthed whereas lead 5d connected to terminal 5a is brought to a positive potential having a given value, e.g. 100 V. On the other hand, the outputs of generator 2 are not brought to a given reference voltage; in other words, the aforementioned outputs of the power generator are "floating". In order to check the insulation of leads 3 and 4 with respect to generator 5, the generator is connected to leads 3 and 4 while ensuring, of course, that the current supplied by generator 5 to receiver 1 is below the operating threshold $I_1$.

It is not necessary to interconnect the terminals of similar polarity of generators 5 and 2. An alternative possibility is to connect the positive terminal 5a to lead 4 (connected to the negative terminal of generator 2) and similarly connect 5b to lead 3.

As already mentioned, the insulation check signal appearing at output 6c can be used to actuate the power generator 2. More specifically, in the example illustrated in FIGS. 2 and 3, operation of generator 2 stops as soon as a fault occurs in the insulation. When a corresponding fault (e.g. connection 10 in FIG. 1) occurs under these conditions, the power generator 2 stops and, in the example, the vehicle is braked. At the same time, the alarm means 30 are triggered, indicating the braking system must be repaired before the vehicle can start again. Note that the circuit would not be completely safe or "fail-safe" if only the operation of generator 2 were controlled. The reason is as follows: If a fault occurs such that lead 4 is connected to lead 5c and lead 3 is connected to 5d, generator 5 will completely take the place of generator 2 and the brakes can never be applied; consequently the alarm means 30 are necessary. However, the probability of such a fault occurring is practically zero, since it will be necessary for the two previously-mentioned faults to occur simultaneously.

Figure 2:
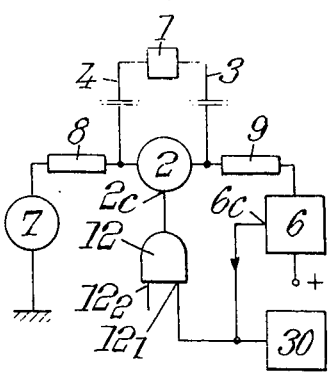
FIG. 2 is a simplified view of a safety device according to the invention for actuating an installation comprising a power generator and a receiver, the device comprising a checking device of the kind shown in FIG. 1.
Figure 3:
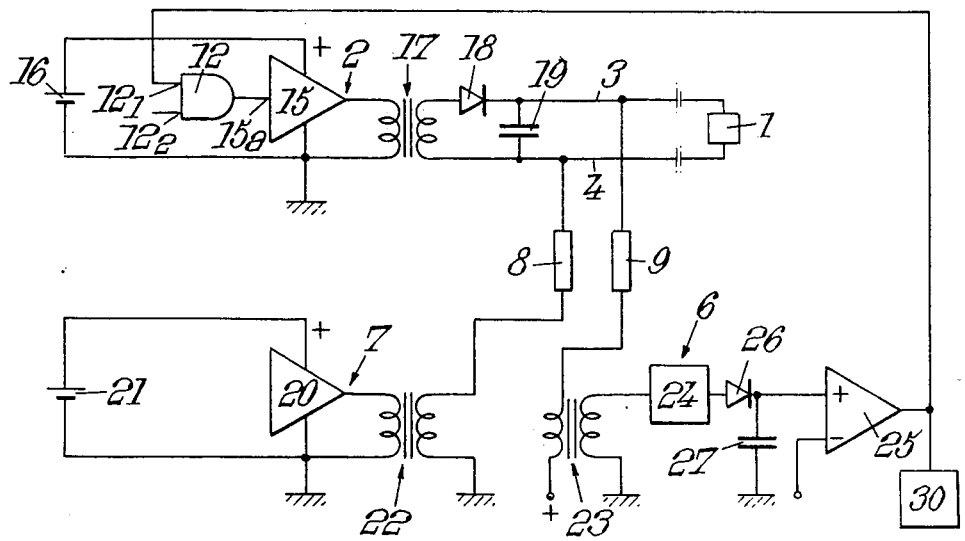
FIG. 3 is a more detailed view of the control device shown in FIG. 2.

We shall now with reference to FIGS. 2 and 3, describe an embodiment of a safety device for stopping generator 2 as soon as a fault occurs in the insulation of leads 3 and 4 with respect to the interference generator.

In a safety device of the kind in question, generator 2 has a control input 2c connected to the output of an AND gate 12 whose first input $12_1$ is connected to output 6c of detector 6. The second output $12_2$ of gate 12 is connected to the output of a means (not shown) for transmitting a signal for actuating the generator 2.

In this embodiment, when there is no fault in the insulation of conductors 3 and 4, the output of detector c is at a level "1", which is applied to input $12_1$ of the AND gate. Under these conditions, generator 2 operates normally. When, however, a fault occurs in the insulation, a "0-level" signal is produced at output 6c. Thus, generator 2 cannot operate and the vehicle is braked, as a result of the disappearance of the signal at the terminals of solenoid valve 1.

FIG. 3 is a more detailed illustration of the safety device which has been described with reference to FIG. 2. In this example, generator 2 comprises a power amplifier 15 whose input 15a is connected to the output of AND gate 12, The control signal applied to input $12_2$ of gate 12 is an a.c. signal. The amplifier is supplied by a d.c. source 16, and its output is connected to the primary winding of an insulation transformer 17. The secondary winding of transformer 17 is connected to leads 3, 4 via rectifying means comprising a diode 18 and capacitor 19.

The checking generator comprises an oscillator 20 supplied by a d.c. source 21. Oscillator 20 delivers current to the primary winding of a second insulation transformer 22. The first terminal of the secondary winding of transformer 22 is connected to earth, whereas its second terminal is connected to an injection resistor 8.

Detector 6 comprises an insulation transformer 23 whose primary winding is connected at one end to a terminal of recovery resistor 9 and at the other end to the positive terminal of the interference generator. The secondary winding of transformer 23 is connected to a phase-band filter 24 centred at the frequency $f$ (the frequency of the signals produced by oscillator 20). The output of filter 24 is connected to the positive input of a comparator 25 via rectifying means comprising a diode 26 and capacitor 27. The negative input of comparator 25 is connected to the output of a reference signal source (not shown). The source supplies the aforementioned negative input of comparator 25 with a signal representing the intensity threshold $i_1$. The output of comparator 5 is connected to input $12_1$ of AND gate 12.

The checking and safety devices described in conjunction with the drawings can be modified in numerous ways without thereby departing from the invention. For example, although in the described embodiments the power generator transmits a d.c. signal and a checking generator transmits an a.c. signal having a set frequency $f$, it is sufficient in general if the signal produced by the checking generator cannot influence the receiver 1 and if detector 6 is sensitive to the signals produced by generator 7 and insensitive to the signals produced by generator 2 or the interference generator. For example, in an alternative embodiment receiver 1 is sensitive to a.c. signals at frequency $f_1$, in which case generator 7 must comprise a generator of a.c. signals having a frequency $f_2$ different from frequency $f_1$.

Of course, the applications of the invention are numerous and, of course, are not limited to the example given hereinbefore. The checking and safety devices according to the invention can be used whenever necessary to check that the leads connecting a power generator to a receiver are insulated with respect to an interference generator which may actuate the receiver.

Clearly and as the preceding shows, the invention is in no way limited to those applications and embodiments which have been described in detail, but includes all variants.

We claim:

1. A device for checking the insulation of first and second leads connecting the output terminals of a power generator to a receiver sensitive to signals having a set nature and an amplitude above a given threshold, characterized in that, in order to check the insulation of the leads with respect to an inteference generator having first and second output terminals and operative to transmit signals having the set nature, said device comprises:

current-detecting means having a first input terminal connected to said first lead and a second input terminal connected to said first output terminal of said interference generator, said current-detecting means being sensitive to a signal having a second nature different from the set nature, insensitive to the signals having the set nature, and operative to deliver a signal at a first level when the current between said first and second input terminals is above a threshold $i_1$ and a signal at a second level when the current is below the threshold $i_1$;

a checking generator for producing signals having the second nature, said checking generator having a first output terminal connected to said second lead and a second output terminal connected to said second output terminal of said interference generator;

a first impedance disposed in series with said current-detecting means between said first lead and said first output terminal of said interference generator; and a second impedance disposed in series with said checking generator between said second lead and said second output terminal of said interference generator, the values of said first and second impedances being chosen so that the amplitude of the signals produced by said interference generator and reaching said receiver is below the threshold.

2. The checking device of claim 1, wherein said signals having the set nature are at a different frequency from said signals having the second nature.

3. The checking device of claim 2, wherein, at the frequency of said signals having the second nature, said power generator has a low impedance compared with said first and said second impedance.

4. The checking device of claim 2, further comprising shunting means disposed in parallel with said power generator, said shunting means having at the frequency of said signals having the second nature, a small impedance compared with said first and said second impedance.

5. The checking device of claim 2, wherein said set-nature signals are d.c. signals of zero frequency.

6. The checking device of claim 4, wherein said set-nature signals are d.c. signals of zero frequency and said shunting means comprises a capacitor disposed between said first and said second output terminal of said power generator.

7. The checking device of claim 1, wherein said current-detecting means comprise comparators.

8. The checking device of claim 1, further comprising alarm means sensitive to said second-level signals and the output of said current-detecting means.

9. A safety device for actuating an assembly comprising a power generator having a control input, a receiver and first and second insulated means connecting said power generator to said receiver, said receiver being sensitive to signals having a set nature and an amplitude above a given threshold, said device comprising:

a device for checking the insulation of said first and second leads with respect to an interference generator having first and second output terminals and operative to transmit signals having the set nature, said checking device including:

current-detecting means having a first input terminal connected to said first lead and a second input terminal connected to said first output terminal of said interference generator, said current-detecting means being sensitive to a signal having a second nature different from the set nature, insensitive to the signals having the set nature, and having an output which delivers a signal at a first level when the current between said first and second input terminals is above a threshold $i_1$ and a signal at a second level when the current is below the threshold $i_1$;

a checking generator for producing signals having the second nature, said checking generator having a first output terminal connected to said second lead and a second output terminal connected to said second output terminal of said interference generator;

a first impedance disposed in series with said current-detecting means between said first lead and said first output terminal of said interference generator, and a second impedance disposed in series with said checking generator between said second lead and said second output terminal of said interference generator, the values of said first and second impedances being chosen so that the amplitude of the signals produced by said interference generator and reaching said receiver is below the threshold; and control means comprising an AND gate having an output connected to said control input, and a first and a second input, said first input being for receiving a signal actuating the power generator and said second input being connected to the output of the current-detecting means in said checking device.

10. A device for checking the insulation of first and second leads connecting the output terminals of a power generator to a receiver sensitive to signals having a set nature and an amplitude above a given threshold, characterized in that, in order to check the insulation of the leads with respect to an interference generator having first and second output terminals and operative to transmit signals having the set nature, said device comprises:

current-detecting means having a first input terminal connected to said first lead and a second input terminal connected to said first output terminal of said interference generator, said current-detecting means being sensitive to a signal having a second nature different from the set nature, insensitive to the signals having the set nature, and operative to deliver a signal at a first level when the current between said first and second input terminals is above a threshold $i_1$ and a signal at a second level when the current is below the threshold $i_1$;

a checking generator for producing signals having the second nature, said checking generator having a first output terminal connected to said second lead and a second output terminal connected to said second output terminal of said interference generator; and impedance means disposed in series with said current-detecting means between said leads and said output terminals of said interference generator, the value of said impedance means being chosen so that the amplitude of the signals produced by said interference generator and reaching said receiver is below the threshold.

* * * * *